United States Patent
Lin

(10) Patent No.: US 10,012,445 B2
(45) Date of Patent: Jul. 3, 2018

(54) VAPOR CHAMBER AND HEAT PIPE COMBINED STRUCTURE

(71) Applicant: TAIWAN MICROLOOPS CORP., New Taipei (TW)

(72) Inventor: Chun-Hung Lin, New Taipei (TW)

(73) Assignee: TAIWAN MICROLOOPS CORP., New Taipei (TW)

( * ) Notice: Subject to any disclaimer, the term of this patent is extended or adjusted under 35 U.S.C. 154(b) by 43 days.

(21) Appl. No.: 15/260,035

(22) Filed: Sep. 8, 2016

(65) Prior Publication Data

US 2018/0066896 A1   Mar. 8, 2018

(51) Int. Cl.
*F28F 7/00* (2006.01)
*F28D 15/04* (2006.01)

(52) U.S. Cl.
CPC .................................. *F28D 15/04* (2013.01)

(58) Field of Classification Search
CPC ...... F28D 15/04; F28D 15/043; F28D 15/046; F28D 2015/0216; F28D 2021/0028; F28D 2021/0029; H05K 7/20336; H05K 7/2029; H05K 7/208; H05K 7/20809; H05K 7/20818; H05K 7/20881; H05K 7/20936; H05K 7/2099; F21V 29/006; F21V 29/40; F21V 29/402; F21V 29/51; H01F 27/18; H01L 23/427; H01L 33/648; H01L 23/40; H01L 23/46; H01L 23/473; H01L 23/4735
USPC ............................ 165/80.4, 104.26; 361/700
See application file for complete search history.

(56) References Cited

U.S. PATENT DOCUMENTS

| | | | | |
|---|---|---|---|---|
| 3,661,202 A | * | 5/1972 | Moore, Jr. | F28D 15/06 126/350.2 |
| 5,216,580 A | * | 6/1993 | Davidson | F28D 15/0266 165/104.33 |
| 7,540,318 B2 | * | 6/2009 | Nitta | F28D 15/0233 165/104.26 |
| 2004/0118553 A1 | * | 6/2004 | Krassowski | C04B 41/009 165/104.26 |
| 2005/0173098 A1 | * | 8/2005 | Connors | F28D 15/02 165/104.33 |
| 2009/0025910 A1 | * | 1/2009 | Hoffman | F28D 15/046 165/104.26 |
| 2009/0294117 A1 | * | 12/2009 | Hodes | F28D 15/06 165/287 |
| 2010/0108297 A1 | * | 5/2010 | Chen | F28D 15/0233 165/104.26 |

(Continued)

*Primary Examiner* — Justin Jonaitis
(74) *Attorney, Agent, or Firm* — Chun-Ming Shih; HDLS IPR Services

(57) ABSTRACT

A vapor chamber and heat pipe combined structure includes a vapor chamber, a first capillary tissue, a heat pipe, and a working fluid. The vapor chamber includes an upper metal casing, a lower metal casing, a containing chamber between the upper and lower metal casings, a riser at the lower metal casing, and a through hole communicated with the containing chamber. The first capillary tissue is installed in the containing chamber and has a receiving hole corresponsive to the through hole. The heat pipe includes a pipe body and a second capillary tissue installed in the pipe body and extended out of the pipe body to form an exposed section. The heat pipe is connected to the through hole and the receiving hole, so that the exposed section is attached to the receiving hole of the first capillary tissue. The working fluid is filled into the containing chamber.

7 Claims, 5 Drawing Sheets

(56) References Cited

U.S. PATENT DOCUMENTS

| | | | | |
|---|---|---|---|---|
| 2014/0182819 A1* | 7/2014 | Yang | ................ | F28D 15/04 |
| | | | | 165/104.26 |
| 2014/0216691 A1* | 8/2014 | Yang | ................ | F28D 15/04 |
| | | | | 165/104.26 |
| 2017/0153064 A1* | 6/2017 | Lan | ................ | F28D 15/046 |
| 2017/0292793 A1* | 10/2017 | Sun | ................ | F28D 15/0233 |

* cited by examiner

VAPOR CHAMBER AND HEAT PIPE COMBINED STRUCTURE

FIELD OF THE INVENTION

The technical field generally relates to a thermal conduction technology, more particularly to a vapor chamber and heat pipe combined structure.

BACKGROUND OF THE INVENTION

As the computing speed of electronic devices increases, the heat generated by the electronic devices becomes increasingly higher. To overcome the large quantity of generated heat, manufacturers have introduced and extensively used a heat pipe and a vapor chamber with good thermal conductivity. Although a gas-state working fluid in the heat pipe has the same flowing direction, the heat conducted by the working fluid is very limited due to the limitation of volume. On the other hand, although the vapor chamber has a relatively large heated surface for attaching a heat source and conducting heat directly, yet the flowing direction of the gas-state working fluid is disordered, and the heat conduction and dissipation performance of the vapor chamber is limited.

To overcome these problems, related manufactures integrate the heat pipe and the vapor chamber to form a combined structure, wherein the heat pipe is passed and connected to a side edge of the vapor chamber, and the internal space of the heat pipe and the internal space of the vapor chamber are communicated with each other.

Although the conventional vapor chamber and heat pipe combined structure has the heat conduction and dissipation effect, the following problems still exist. Since the capillary tissue in the heat pipe is not attached to the capillary tissue in the vapor chamber, therefore the liquid-state working fluid may be interrupted or discontinuous in the reflux process, and the heat conduction and dissipation performance is lowered significantly. In addition, the vapor chamber usually has a thin wall, and a rim is generally formed on the wall of the vapor chamber to provide a support to the heat pipe and keep the heat pipe on the vapor chamber securely, and thus incurring a more complicated manufacturing process and a higher manufacturing cost. Obviously, requirements are needed.

SUMMARY OF THE INVENTION

It is a primary objective of this disclosure to provide a vapor chamber and heat pipe combined structure that facilitates the connection and fixation of the heat pipe and improves the reflux speed of the liquid-state working fluid.

To achieve the aforementioned and other objectives, this disclosure provides a vapor chamber and heat pipe combined structure, comprising a vapor chamber, a first capillary tissue, a heat pipe and a working fluid, wherein the vapor chamber comprises an upper metal casing, a lower metal casing closely engaged with the respective upper metal casing, a containing chamber formed between the upper metal casing and the lower metal casing, a riser disposed at the lower metal casing, and a through hole formed on the riser and communicated with the containing chamber; the first capillary tissue is installed in the containing chamber and has a receiving hole configured to be corresponsive to the through hole; the heat pipe comprises a pipe body and a second capillary tissue, and the second capillary tissue is installed in the pipe body and extended to the outside of the pipe body to form an exposed section, and the heat pipe is passed and connected to the through hole and the receiving hole, so that the exposed section is attached to the receiving hole of the first capillary tissue; and the working fluid is filled into the containing chamber.

The vapor chamber and heat pipe combined structure of this disclosure further has the following effects. The first capillary tissue and the second capillary tissue are attached to each other to improve the reflux speed of the working fluid, and the conical receiving hole is capable of fitting various heat pipes of different diameters and accommodating discrepancy of the heat pipe product caused during the manufacturing process, so that the first capillary tissue can be used in these situations. Each penetrating hole of the heat pipe is designed in the receiving hole, so that the liquid-state working fluid can pass through each penetrating hole to further improve the reflux speed of the working fluid. Since the receiving hole is a blind hole, therefore the heat pipe passing through the receiving hole has a limiting effect to improve the ease of installation.

DESCRIPTION OF THE PREFERRED EMBODIMENTS

The technical contents of this disclosure will become apparent with the detailed description of preferred embodiments accompanied with the illustration of related drawings as follows. It is intended that the embodiments and figures disclosed herein are to be considered illustrative rather than restrictive.

Figure 1:
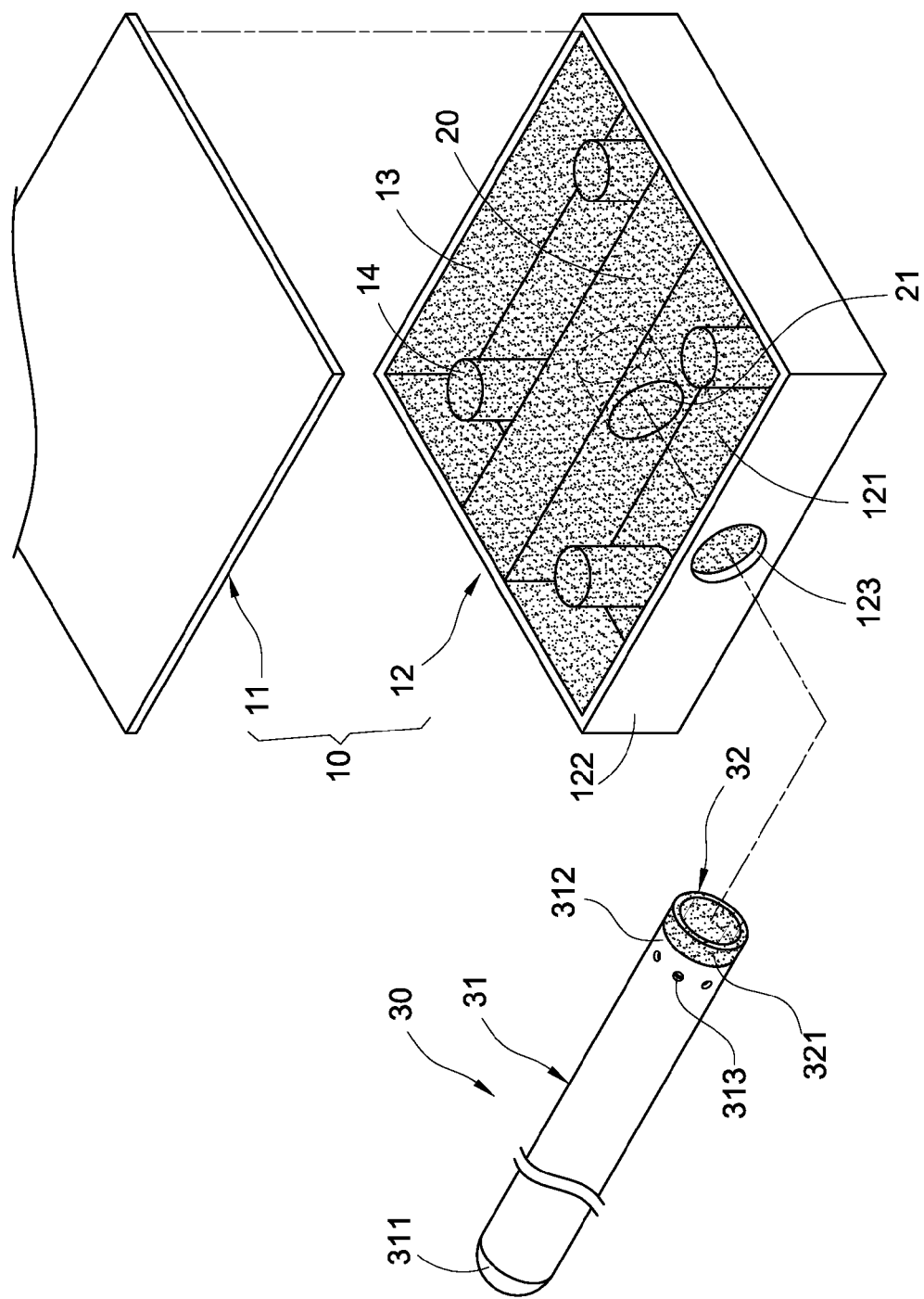
FIG. 1 is an exploded view of a first preferred embodiment of this disclosure.
Figure 2:
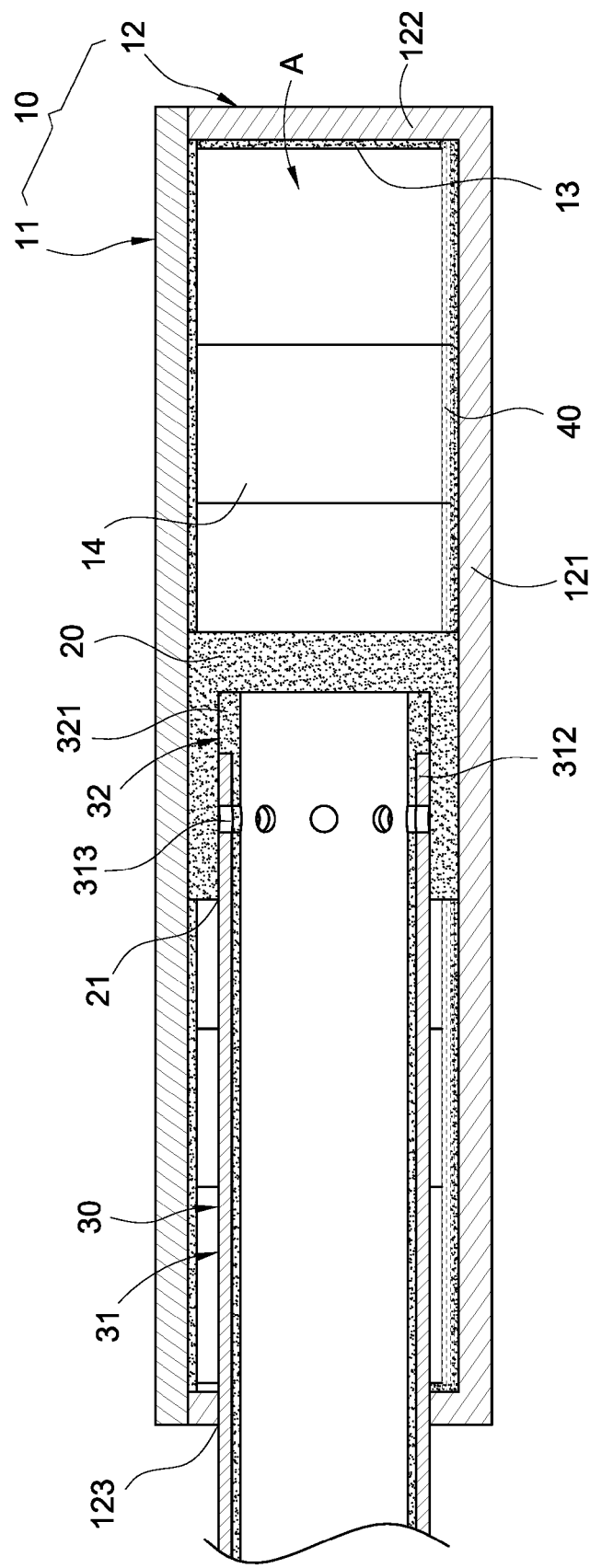
FIG. 2 is a cross-sectional view of the first preferred embodiment of this disclosure.

With reference to FIGS. 1 and 2 for a vapor chamber and heat pipe combined structure of this disclosure, the vapor chamber and heat pipe combined structure comprises a vapor chamber 10, a first capillary tissue 20, a heat pipe 30, and a working fluid 40.

The vapor chamber 10 comprises an upper metal casing 11, a lower metal casing 12, a capillary structure 13 and a plurality of supporting bodies 14, and the upper metal casing 11 is made of a material such as copper, aluminum, or their alloys with good thermal conductivity, and the lower metal casing 12 is made of the same material of the upper metal casing 11, wherein the lower metal casing 12 of this embodiment has a rectangular base plate 121 and a riser 122 upwardly bent and extended from the rectangular base plate 121, and the lower metal casing 12 is configured to be corresponsive to the upper metal casing 11 for a close engagement, so that a containing chamber A is formed between the upper metal casing 11 and the lower metal casing 12, and the riser 122 has a through hole 123 communicated with the containing chamber A. The capillary structure 13 is made of a material such as a metal mesh, a fiber bundle, or a metal powder sinter, etc and formed on the inner walls of the upper metal casing 11 and the lower metal casing 12. The supporting body 14 is also made of a material such as a metal mesh, a fiber bundle, or a metal powder sinter, etc, and each supporting body 14 is installed between the upper metal casing 11 and the lower metal casing 12 and closely attached to the capillary structure 13.

The first capillary tissue 20 is installed in the containing chamber A and made of a material such as a metal powder sinter, etc, wherein the first capillary tissue 20 of this embodiment is an elongated block having a receiving hole 21 formed at a middle position and configured to be corresponsive to the through hole 123, and the receiving hole 21 of this embodiment is a blind hole, but the invention is not limited to the blind hole only.

The heat pipe 30 comprises a pipe body 31 and a second capillary tissue 32, and the pipe body 31 is made of a material such as copper, aluminum, or their alloy with good thermal conductivity, and the pipe body 31 has a closed end 311, an open end 312, and a plurality of penetrating holes 313 formed at positions with an appropriate distance from the open end 312, and the second capillary tissue 32 is made of a material such as a metal mesh, a fiber bundle, or a metal powder sinter, etc and installed to the inner wall of the pipe body 31, and extended from the open end 312 to the outside of the pipe body 31 to form an exposed section 321, and the open end 312 of the heat pipe 30 is passed and connected to the through hole 123 and the receiving hole 21 sequentially, so that the exposed section 321 and the receiving hole 21 of the first capillary tissue 20 are closely attached, and the penetrating hole 313 is also disposed in the receiving hole 21, so that the refluxed liquid-state working fluid can be passed through each penetrating hole 313 to improve the reflux speed of the liquid-state working fluid.

The working fluid 40 (which may be water) is filled into the containing chamber A formed between the upper metal casing 11 and the lower metal casing 12 through a liquid-inputting gas-removing tube (not shown in the figure) which is communicated with the containing chamber A, and the liquid-inputting gas-removing tube is provided for removing gas and finally sealed to form the vapor chamber and heat pipe combined structure of this disclosure.

Figure 3:
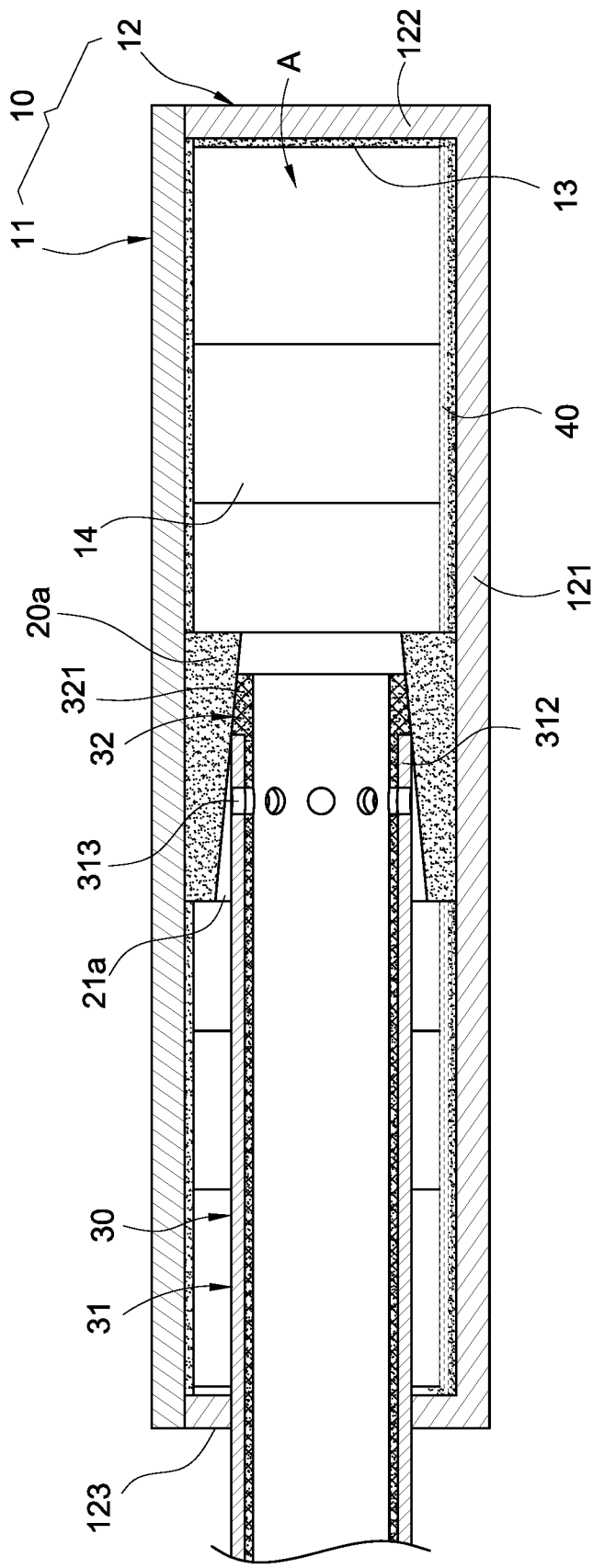
FIG. 3 is a cross-sectional view of a second preferred embodiment of this disclosure.

With reference to FIG. 3, the difference of this embodiment and the previous embodiment resides on that the receiving hole 21a of the first capillary tissue 20a is a conical penetrating hole, and when an open end 312 of the heat pipe 30 is passed and connected to the through hole 123 and the receiving hole 21, the external periphery of the exposed section 321 is blocked by the inner wall of the receiving hole 21a, and thus not just facilitating the connection and fixation of the heat pipe 30 only, but also achieving the effect of closely attaching the exposed section 321 with the first capillary tissue 20a to improve the reflux speed of the liquid-state working fluid.

Figure 4:
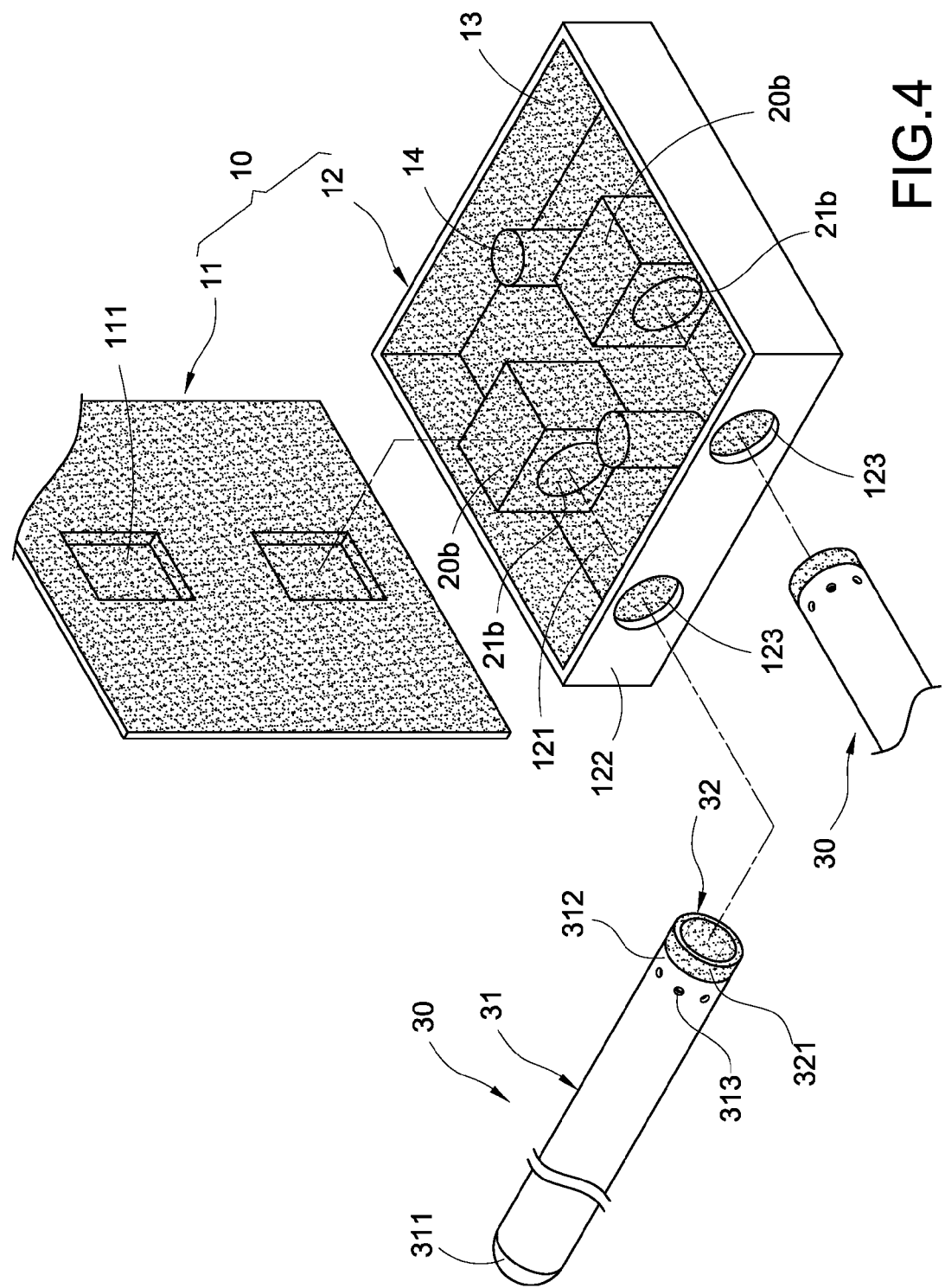
FIG. 4 is an exploded view of a third preferred embodiment of this disclosure.
Figure 5:
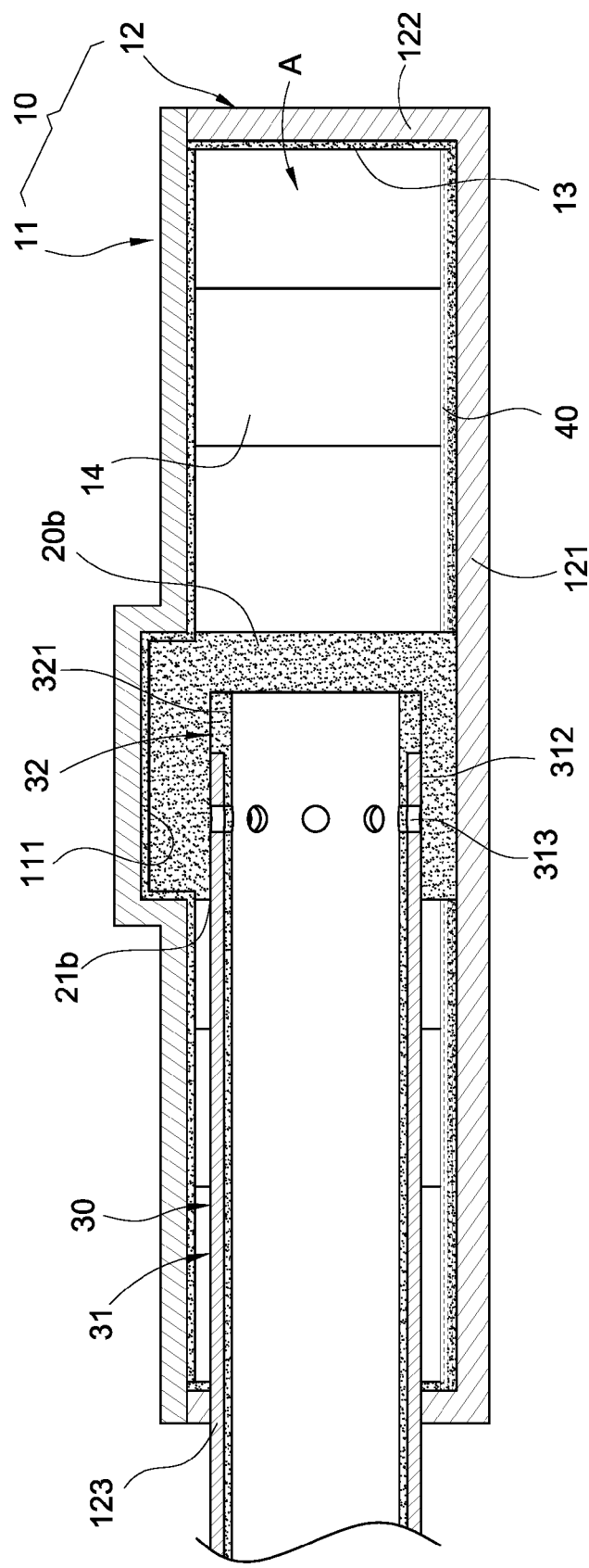
FIG. 5 is a cross-sectional view of the third preferred embodiment of this disclosure.

With reference to FIGS. 4 and 5, the difference between this embodiment and the previous embodiments resides on that the upper metal casing 11 has a plurality of pits 111 stamped and formed therein, and there are two first capillary tissues 20b configured to be corresponsive to the same quantity of pits 111 and embedded in to the two pits 111. Each first capillary tissue 20b has a receiving hole 21b, and each heat pipe 30 is passed through the hole 123 and the receiving hole 21b and coupled to each respective first capillary tissue 20b, and thus not facilitating the installation of each first capillary tissue 20b, the upper metal casing 11, and the lower metal casing 12 only, but also meeting the requirement of dissipating a larger heat source.

While this disclosure has been described by means of specific embodiments, numerous modifications and variations could be made thereto by those skilled in the art without departing from the scope and spirit of this disclosure set forth in the claims.

What is claimed is:

1. A vapor chamber and heat pipe combined structure, comprising:
    a vapor chamber, comprising an upper metal casing, a lower metal casing closely engaged with the upper metal casing, a containing chamber formed between the upper metal casing and the lower metal casing, a riser disposed at the lower metal casing, and a through hole formed on the riser and communicated with the containing chamber;
    a first capillary tissue, installed in the containing chamber, and having a receiving hole configured to be corresponsive to the through hole;
    a heat pipe, comprising a pipe body and a second capillary tissue, and the second capillary tissue being installed in the pipe body and extended to the outside of the pipe body to form an exposed section, and the heat pipe being passed and coupled to the through hole and the receiving hole, so that the exposed section is attached to the receiving hole of the first capillary tissue; and
    a working fluid, within the containing chamber,
    wherein the heat pipe has a plurality of penetrating holes formed at positions proximate to the exposed section, and each penetrating hole is disposed in the receiving hole.

2. The vapor chamber and heat pipe combined structure according to claim 1, wherein the first capillary tissue is an elongated block, and the receiving hole is formed on the elongated block and is a blind hole.

3. The vapor chamber and heat pipe combined structure according to claim 1, wherein the receiving hole is a conical penetrating hole.

4. The vapor chamber and heat pipe combined structure according to claim 1, wherein the vapor chamber further comprises a capillary structure and a plurality of supporting bodies, and the capillary structure is formed on inner walls of the upper metal casing and the lower metal casing, and each supporting body is installed between the upper metal casing and the lower metal casing and attached to the capillary structure.

5. The vapor chamber and heat pipe combined structure according to claim 1, wherein the upper metal casing has at least one pit stamped and formed therein, and the first capillary tissue is embedded into and combined with the pit.

6. The vapor chamber and heat pipe combined structure according to claim 5, wherein the at least one pit stamped and formed in the upper metal casing, the first capillary tissues and the at least one pit have the same quantity, and are embedded and combined with one another.

7. A vapor chamber and heat pipe combined structure, comprising:
    a vapor chamber, comprising an upper metal casing, a lower metal casing closely engaged with the upper metal casing, a containing chamber formed between the upper metal casing and the lower metal casing, a riser disposed at the lower metal casing, and a through hole formed on the riser and communicated with the containing chamber;
    a first capillary tissue, installed in the containing chamber, and having a receiving hole configured to be corresponsive to the through hole;
    a heat pipe, comprising a pipe body and a second capillary tissue, and the second capillary tissue being installed in the pipe body and extended to the outside of the pipe body to form an exposed section, and the heat pipe being passed and coupled to the through hole and the receiving hole, so that the exposed section is attached to the receiving hole of the first capillary tissue;
a working fluid, within the containing chamber; and
a plurality of penetrating holes formed at positions proximate to the open end, and each of the penetrating hole being disposed in the receiving hole,
wherein the open end of the pipe body is configured to be corresponsive to the through hole and the receiving hole and passed and combined with the through hole and the receiving hole;
wherein the pipe body has a closed end and an open end, and the exposed section is formed and extended from the open end to the outside of the pipe body.

* * * * *